United States Patent
Zou et al.

(10) Patent No.: US 11,117,797 B2
(45) Date of Patent: Sep. 14, 2021

(54) MEMS DEVICE AND ELECTRONICS APPARATUS

(71) Applicant: GOERTEK. INC, Shandong (CN)

(72) Inventors: Quanbo Zou, Shandong (CN); Zhe Wang, Shandong (CN); You Wang, Shandong (CN); Xianbin Wang, Shandong (CN)

(73) Assignee: GOERTEK. INC, Shandong (CN)

( * ) Notice: Subject to any disclaimer, the term of this patent is extended or adjusted under 35 U.S.C. 154(b) by 187 days.

(21) Appl. No.: 16/339,460

(22) PCT Filed: Oct. 8, 2016

(86) PCT No.: PCT/CN2016/101474
§ 371 (c)(1),
(2) Date: Apr. 4, 2019

(87) PCT Pub. No.: WO2018/064804
PCT Pub. Date: Apr. 12, 2018

(65) Prior Publication Data
US 2020/0039817 A1    Feb. 6, 2020

(51) Int. Cl.
*H04R 25/00*    (2006.01)
*B81B 7/00*    (2006.01)
*H04R 1/04*    (2006.01)
*H04R 19/00*    (2006.01)
*H04R 19/01*    (2006.01)

(52) U.S. Cl.
CPC ............ *B81B 7/0061* (2013.01); *H04R 1/04* (2013.01); *H04R 19/005* (2013.01); *H04R 19/016* (2013.01); *B81B 2201/0257* (2013.01); *B81B 2203/0127* (2013.01); *B81B 2207/012* (2013.01); *H04R 2201/003* (2013.01)

(58) Field of Classification Search
CPC combination set(s) only.
See application file for complete search history.

(56) References Cited

U.S. PATENT DOCUMENTS

| | | | |
|---|---|---|---|
| 9,438,972 B2 | 9/2016 | Wang et al. | |
| 2012/0237073 A1* | 9/2012 | Goida | H04R 1/02 |
| | | | 381/361 |
| 2016/0250649 A1* | 9/2016 | Koike | B01D 46/0032 |
| | | | 96/74 |

FOREIGN PATENT DOCUMENTS

| | | |
|---|---|---|
| CN | 1819708 A | 8/2006 |
| CN | 102707808 A | 10/2012 |
| CN | 103733304 B | 8/2016 |

OTHER PUBLICATIONS

Yang et al., "Micromachined Membrane Particle Filters", Caltech Micromachining Laboratory Electrical Engineering, 136-93, pp. 137-142 (1998).

* cited by examiner

*Primary Examiner* — Amir H Etesam
(74) *Attorney, Agent, or Firm* — Ajay A. Jagtiani; Miles & Stockbridge P.C.

(57) ABSTRACT

The present invention discloses a MEMS device and an electronics apparatus. The MEMS device comprises: a substrate; a MEMS element placed on the substrate; a cover encapsulating the MEMS element together with the substrate; and a port for the MEMS element to access outside, wherein the port is provided with a filter which has mesh holes and includes electrets to prevent particles from entering into the MEMS element.

10 Claims, 4 Drawing Sheets

MEMS DEVICE AND ELECTRONICS APPARATUS

CROSS REFERENCE TO RELATED APPLICATIONS

This application is a National Stage of International Application No. PCT/CN2016/101474, filed on Oct. 8, 2016; which is hereby incorporated by reference in its entirety.

FIELD OF THE INVENTION

The present invention relates to the field of MEMS device, and more specifically, to a MEMS device and an electronics apparatus.

BACKGROUND OF THE INVENTION

A Micro-Electro-Mechanical System, or MEMS, is a technology that in its most general form can be defined as miniaturized mechanical and electro-mechanical elements (i.e., devices and structures) that are made using the techniques of micro-fabrication. Generally, a MEMS element is made by the MEMS technology and then is encapsulated into a MEMS device. The MEMS device can further be assembled into an electronics apparatus such as a mobile phone, a pad, a laptop, sensor and so on.

Because of the small size of the MEMS element, the environment of manufacturing will influence the performance of an electronics apparatus which has a MEMS device.

Some of the MEMS devices, such as a MEMS microphone device, a pressure sensor and so on, have a port for the MEMS element to access outside. Dusts or particles may enter the port and thus the performance of the MEMS device may be degraded.

In the prior art, some technicians use a filter with mesh holes at the port to protect the MEMS element. In order to relieve the influence of the dust or particle, technicians try to reduce the size of the acoustic port or to use a rigid plate filter for the port. However, this will degrade the performance of the MEMS device, such Signal-Noise-Ratio (SNR).

In addition, due to fabrication process constraints, it is just feasible to fabricate very large mesh holes currently, for example, the sizes of which are about 100 μm or more. By using such a filter, killer particles for a MEMS element of 2~5 μm, such as PM 2.5 particles, cannot be blocked out efficiently.

Furthermore, the dimension of such a filter will influence the performance of the MEMS device. For example, with the increasing of the thickness of the filter, the SNR may decrease. For example, with the size reduction of the mesh holes of the filter, the SNR may also decrease. For example, with the thickness increase of the filter, the frequency response of the MEMS device may be deviated.

U.S. Pat. No. 9,438,972 B2 discloses a Silicon based MEMS microphone, a system and a package with the same, which is hereby incorporated herein by reference.

U.S. Pat. No. 8,447,057 B2 discloses packages and methods for packaging MEMS microphone devices, which is hereby incorporated herein by reference.

X. Yang, et al, Micromachined membrane particle filters, p. 137-142, Micro Electro Mechanical Systems Conference, February 1998 discloses several particle membrane filters with circular, hexagonal and rectangular through holes, which is hereby incorporated herein by reference.

Therefore, there is a demand in the art that a new solution for a MEMS device shall be proposed to address at least one of the problems in the prior art.

SUMMARY OF THE INVENTION

One object of this invention is to provide a new technical solution for a MEMS device.

According to a first aspect of the present invention, there is provided a MEMS device, comprising: a substrate; a MEMS element placed on the substrate; a cover encapsulating the MEMS element together with the substrate; and a port for the MEMS element to access outside, wherein the port is provided with a filter which has mesh holes and includes electrets to prevent particles from entering into the MEMS element.

Optionally or alternatively, the MEMS element is one of the following elements: a MEMS microphone element, a MEMS pressure sensor element, a MEMS humidity sensor element, a MEMS gas sensor element, a MEMS chemical sensor element and a MEMS speaker element.

Optionally or alternatively, the electrets of the filter are surface charged electrets.

Optionally or alternatively, the electrets of the filter are bulk charged electrets.

Optionally or alternatively, the electrets are placed on two surfaces of the filter and are charged with opposite charges.

Optionally or alternatively, the filter is a meshed plate or membrane.

Optionally or alternatively, the filter is made of metal plate, the surfaces of the metal plate are covered by polymer, and the polymer is charged with electret charges.

Optionally or alternatively, the MEMS device further comprises a support substrate, wherein the support substrate is attached with the filter to support the filter.

Optionally or alternatively, the port is provided in the substrate or the cover.

According to a second aspect of the present invention, there is provided an electronics apparatus comprising a MEMS device according to the present invention.

According to an embodiment of this invention, the present invention can reduce the influence of the outside particles on the MEME element.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
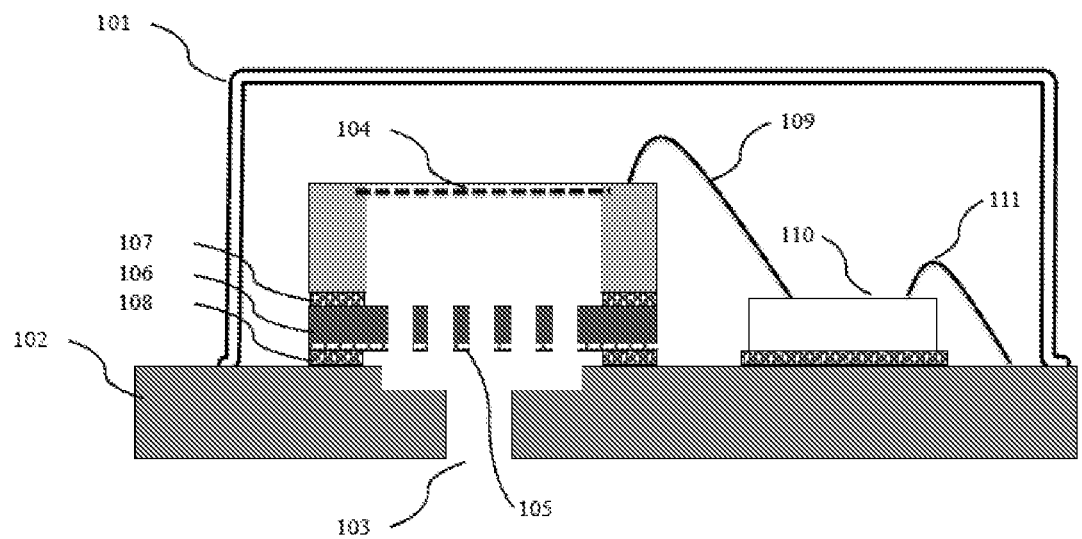
FIG. 1 is a schematic diagram of a MEMS device according to a first embodiment of the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

In the prior art, some of the MEMS devices such as a MEMS sensor are packaged with access port to let the MEMS devices in communication with external environment. For example, the MEMS device includes a microphones, a pressure sensor, a humidity sensor, a gas sensor, a chemical sensor, and so on. However, this kind of ports might cause manufacturing problem of particle contamination during assembly in uncontrolled or low-class factory ambient environment.

Typically, a MEMS device are packaged or encapsulated in clean rooms with eliminated particle contamination. However, in down streaming assembly lines from component-level surface mounting to final system level assembly and test, controlled production environment can hardly be provided, and thus yield losses and reliability issues often take place.

In the prior art, a filter with mesh holes is added onto the MEMD device to fix this issue. The mesh holes have a certain hole size and/or shape so that they can just block out particles of bigger size.

Generally, a filter is made by highly perforating a thin membrane to form mesh holes, to minimize an acoustic resistance and hence SNR/performance degradation. This may make the filter highly fragile and it may incur a high cost to improve the robustness.

Some filter is rigid and thus requires relatively larger mesh holes in order to maintain device performance, particularly for dynamic sensing device such as a microphone. But, the large mesh holes will not block small particles which might also be killers to the MEMS devices.

In this invention, it is proposed to use electret in the filter. This may improve the filtering effect compared with a filter with same mesh hole size and/or shape.

Embodiments and examples will be described with reference to the drawings.

FIG. 1 shows a schematic diagram of a MEMS device according to a first embodiment of the present invention.

In FIG. 1, a MEMS microphone device is showed as an example of the MEMS device for describing an embodiment of this invention.

As shown in FIG. 1, the device comprises a substrate 102, a MEMS element 104, a cover 101 and a port 103.

The MEMS element 104 is placed on the substrate 102. Although a MEMS microphone element 104 is taken as an example of the MEMS element in FIG. 1, it can be other the MEMS element. For example, the MEMS element 104 may be one of the following elements: a MEMS pressure sensor element, a MEMS humidity sensor element, a MEMS gas sensor element, a MEMS chemical sensor element and a MEMS speaker element.

The cover 101 encapsulates the MEMS element 104 together with the substrate 102. It is also placed on the substrate 102.

The port 103 is used for the MEMS element to access outside. The port is provided with a filter 106. The filter 106 has mesh holes and includes electrets 105 to prevent particles from entering into the MEMS element 104. The filter 106 can be a meshed plate or membrane.

For example, the filter 106 can be made of metal plate, and the surfaces of the metal plate are covered by polymer. The polymer is charged with electret charges.

Alternatively or optionally, the mesh holes of the filter is made by micromachining semiconductor fabrication process. Preferably, the filter is formed by silicon with $SiO_2$ or $Si_3N_4$ as surface dielectrics. The surface dielectrics can be charged electret.

In this embodiment, by means of the electrets, the filtering effect of the filter may be improved compared with a prior art filter with similar mesh hole size.

Negligible impact on acoustic performance (e.g., SNR, Frequency Response etc) due to large size of perforation holes on bulk mesh plate, with great reliability.

In FIG. 1, the filter 106 is sandwiched between the substrate 102 and the MEMS element 104 via die attachments 107, 108. The MEMS element 104 can further connect to an ACIS 110 via a wire 109. The ACIS 110 is designed for the MEMS element 104. It can at least preliminarily process the signal from the MEMS element 104. The ASIC 110 can be connected with the substrate 102 via a wire 111.

FIGS. 2-8 shows some arrangement of electrets according to embodiments of the present invention.

The electrets of the filter can be surface charged electrets.

Figure 2:
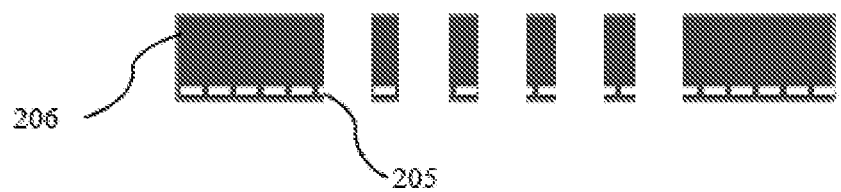
FIGS. 2-8 shows some arrangement of electrets according to embodiments of the present invention.

As shown in FIG. 2, the electrets 205 are arranged on the lower surface of the filter 206.

Figure 3:
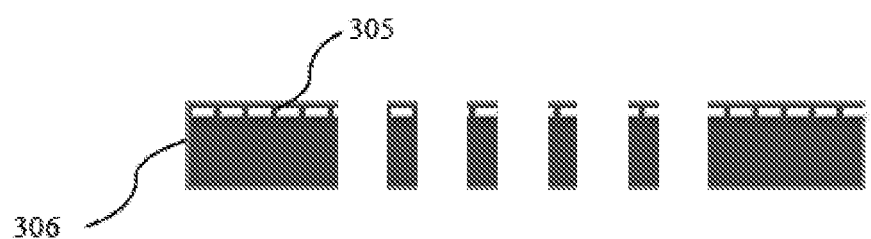

As shown in FIG. 3, the electrets 305 are arranged on the upper surface of the filter 306.

Figure 4:
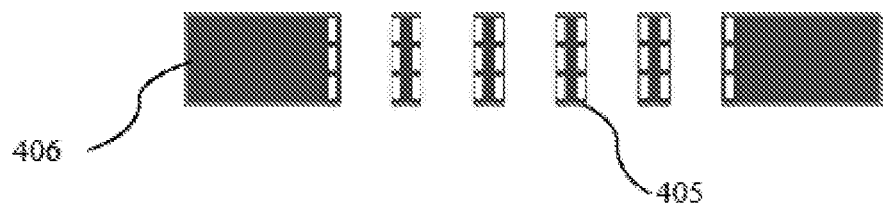

As shown in FIG. 4, the electrets 405 are arranged on the surfaces of the side walls of the mesh holes of the filter 406.

Figure 5:
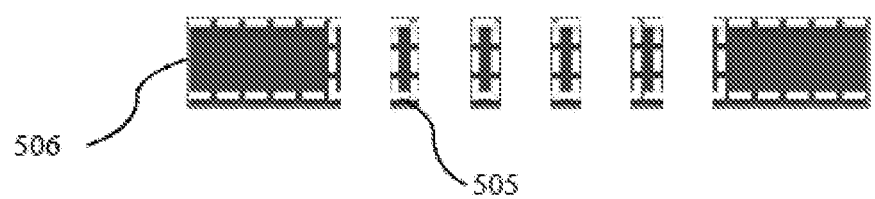

As shown in FIG. 5, the electrets 505 are arranged on upper and lower surfaces of the filter 506 as well as the surfaces of the side walls of the mesh holes of the filter 506.

Figure 6:
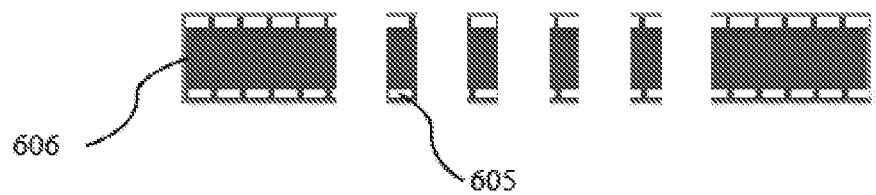

As shown in FIG. 6, the electrets 605 are arranged on upper and lower surfaces of the filter 606.

Figure 7:
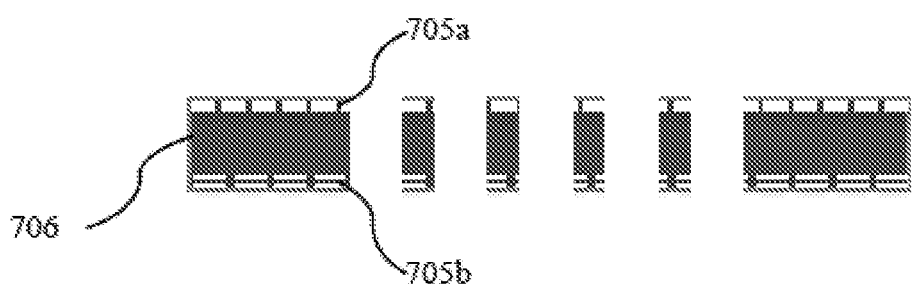

As shown in FIG. 7, the electrets 705a and 705 are charged with opposite charges. They are arranged on the upper and lower surfaces of the filter 706. By using opposite charged electrets, particles of both charge type can be filtered.

Figure 8:
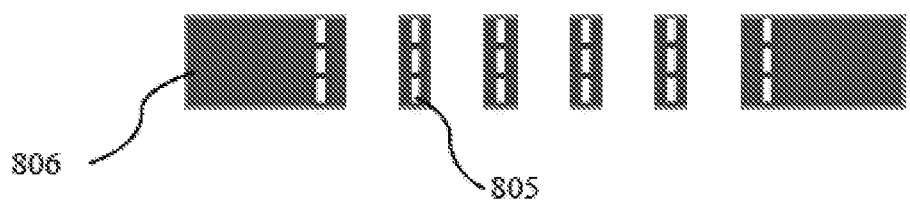

As shown in FIG. 8, the electrets 805 of the filter 806 are bulk charged electrets. Compared with the surface charged electrets, the bulk charged electrets can last for a longer period.

FIGS. 9-12 shows some arrangement of ports for MEMS devices according to embodiments of the present invention.

The port can be provided in the substrate or the cover.

Figure 9:
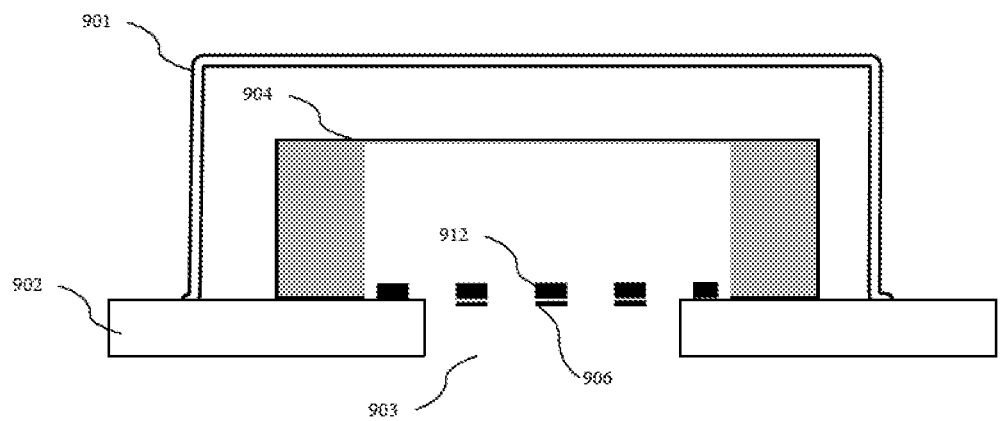
FIGS. 9-12 shows some arrangement of ports for MEMS devices according to embodiments of the present invention.

As shown in FIG. 9, the port 903 is provided on the substrate 902. The filter 906 with electrets is provided at the port 903. A support substrate 912 is attached with the filter 906 to support it. A cover 901 encapsulates a MEMS element 904 together with the substrate 902 and the filter 906.

Figure 10:
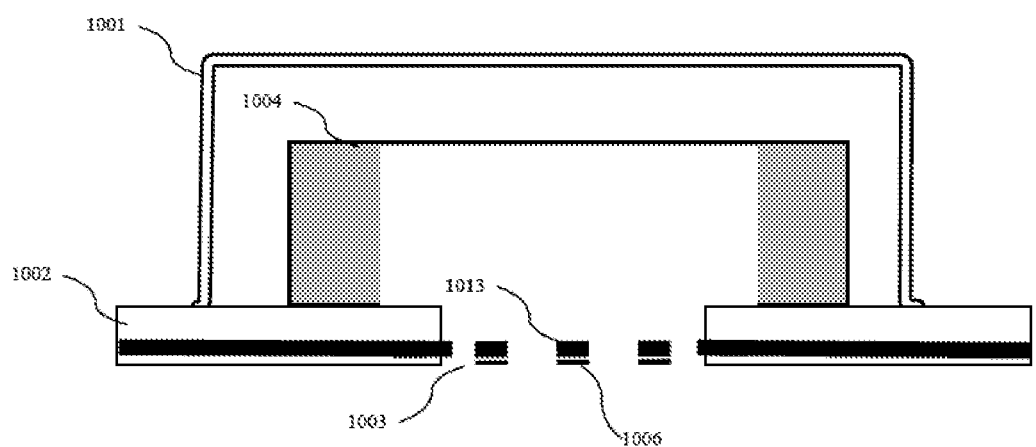

In the example of FIG. 10, a copper layer 1013 of the substrate 1002 can be used to support the filter 1006. The copper layer 1013 has meshed holes corresponding to those of the filter 1006 at the port 1003. A cover 1001 encapsulates a MEMS element 1004 together with the substrate 1002 and the filter 1006.

Figure 11:
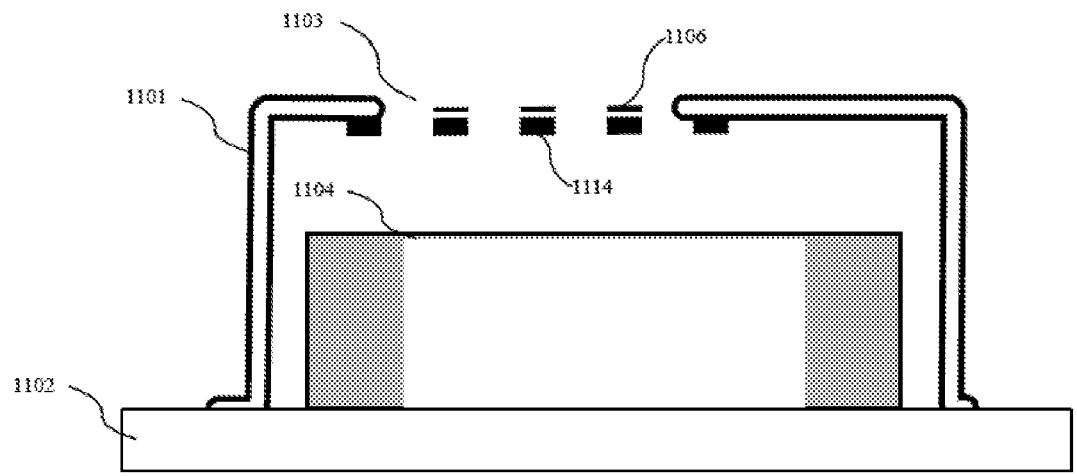

As shown in FIG. 11, the port 1103 is provided on the cover 1101. The filter 1106 with electrets is provided at the port 1103. A support substrate 1112 is attached with the filter 1106 to support it. A cover 1101 encapsulates a MEMS element 1104 together with the substrate 1102 and the filter 1106.

Figure 12:
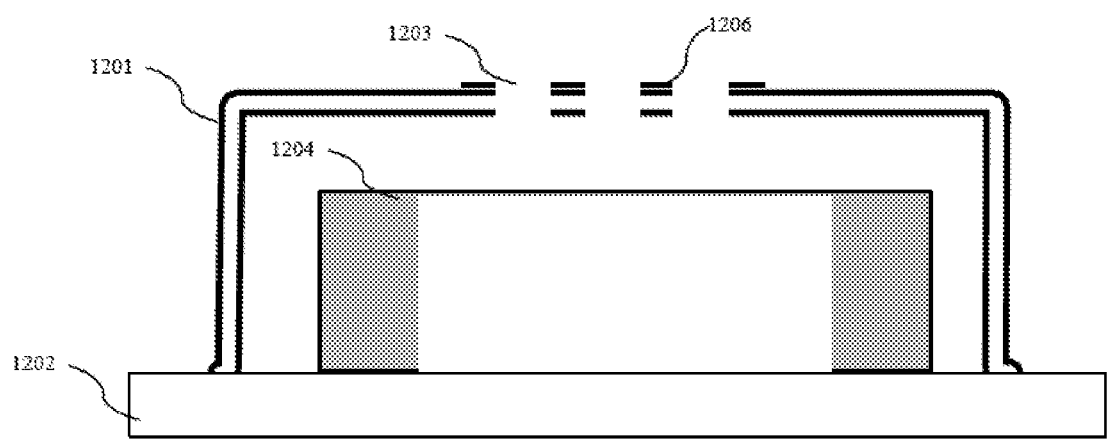

In the example of FIG. 12, the filter 1206 is attached on the cover 1201 and is supported by the cover 1201. The cover 1201 has meshed holes corresponding to those of the filter 1006 at the port 1203. A cover 1201 encapsulates a MEMS element 1204 together with the substrate 1202 and the filter 1206.

The MEMS device according to any embodiment of this invention can be used in an electronics apparatus such as a mobile phone, a pad, a laptop and headset, sensing apparatus and so on.

Although some specific embodiments of the present invention have been demonstrated in detail with examples, it should be understood by a person skilled in the art that the above examples are only intended to be illustrative but not to limit the scope of the present invention.

What is claimed is:

1. A MEMS device, comprising:
   a substrate;
   a MEMS element placed on the substrate;
   a cover encapsulating the MEMS element together with the substrate; and
   a port for the MEMS element to access outside,
   wherein the port is provided with a filter which has mesh holes and includes electrets to prevent particles from entering into the MEMS element, and the electrets are placed on two surfaces of the filter and are charged with opposite charges.

2. The MEMS device according to claim 1, wherein the MEMS element is one of the following elements: a MEMS microphone element, a MEMS pressure sensor element, a MEMS humidity sensor element, a MEMS gas sensor element, a MEMS chemical sensor element and a MEMS speaker element.

3. The MEMS device according to claim 1, wherein the electrets of the filter are surface charged electrets.

4. The MEMS device according to claim 1, wherein the electrets of the filter are bulk charged electrets.

5. The MEMS device according to claim 1, wherein the filter is a meshed plate or membrane.

6. The MEMS device according to claim 1, wherein the filter is made of metal plate, the surfaces of the metal plate are covered by polymer, and the polymer is charged with electret charges.

7. The MEMS device according to claim 1, further comprising a support substrate, wherein the support substrate is attached with the filter to support the filter.

8. The MEMS device according to claim 1, wherein the port is provided in the substrate or the cover.

9. An electronic apparatus comprising a MEMS device according to claim 1.

10. An electronic apparatus comprising a MEMS device according to claim 2.

* * * * *